United States Patent
Schuhmacher et al.

(10) Patent No.: US 7,169,479 B2
(45) Date of Patent: Jan. 30, 2007

(54) GRAIN-ORIENTED MAGNETIC STEEL SHEET COMPRISING AN ELECTRICALLY INSULATING COATING

(75) Inventors: Bernd Schuhmacher, Dortmund (DE); Klaus Guenther, Voerde (DE); Hermann Hingmann, Dinslaken (DE); Klaus Bewilogua, Braunschweig (DE); Claus-Peter Klages, Braunschweig (DE); Heinz Dimigen, Hamburg (DE); Thomas Jung, Hoetzum (DE)

(73) Assignee: ThyssenKrupp Electrical Steel EBG GmbH, Bochum (DE)

( * ) Notice: Subject to any disclaimer, the term of this patent is extended or adjusted under 35 U.S.C. 154(b) by 0 days.

(21) Appl. No.: 10/481,526

(22) PCT Filed: Jun. 21, 2002

(86) PCT No.: PCT/EP02/06869

§ 371 (c)(1),
(2), (4) Date: Aug. 13, 2004

(87) PCT Pub. No.: WO03/000951

PCT Pub. Date: Jan. 3, 2003

(65) Prior Publication Data

US 2005/0112377 A1    May 26, 2005

(30) Foreign Application Priority Data

Jun. 22, 2001 (DE) ................. 101 30 308

(51) Int. Cl.
*B32B 15/04* (2006.01)
*B32B 15/18* (2006.01)
*B05D 5/12* (2006.01)

(52) U.S. Cl. ............... 428/634; 428/411.1; 428/681; 427/116

(58) Field of Classification Search ............. 428/411.1, 428/634, 681; 427/116, 902
See application file for complete search history.

(56) References Cited

U.S. PATENT DOCUMENTS 3,839,256 A * 10/1974 Parkinson .................. 524/188
5,753,051 A    5/1998 Kanai et al.
6,280,862 B1   8/2001 Inokuti

FOREIGN PATENT DOCUMENTS

| DE | 19825860 | 12/1999 |
| DE | 19834968 | 2/2000 |
| EP | 0 600 533 | 6/1994 |
| EP | 0600533 A1 * | 6/1994 |
| WO | WO 99/47346 | 9/1999 |
| WO | WO 00/47402 | 8/2000 |

* cited by examiner

*Primary Examiner*—Michael E. Lavilla
(74) *Attorney, Agent, or Firm*—Proskauer Rose LLP

(57) ABSTRACT

The invention relates to a grain-oriented magnetic steel sheet including an electrically insulating coating made of an amorphous carbon-hydrogen network, which is applied after final annealing in order to ensure electrical insulation of the individual layers of the sheet. The grain-oriented magnetic steel sheet including the electrically insulating coating made of an amorphous carbon-hydrogen network can be used in transformers.

25 Claims, 2 Drawing Sheets

GRAIN-ORIENTED MAGNETIC STEEL SHEET COMPRISING AN ELECTRICALLY INSULATING COATING

BACKGROUND OF THE INVENTION

The present invention relates to a new grain-oriented magnetic steel sheet with an electrically insulating coating which is applied after final annealing in order to ensure electrical insulation of the individual layers of sheet, for use of the grain-oriented magnetic steel sheet e.g. in transformers. The invention also relates to a method for producing the grain-oriented magnetic steel sheet with an electrically insulating coating.

For further use, e.g. in transformers, it is important to reduce the hysteresis loss. One measure for this which is frequently used is to add by alloying silicon which results in an increase in the specific electrical resistance and thus in a reduction in eddy-current losses. By means of modifications in the chemical composition and the cold-rolling and annealing processes, crystal orientation {110} <001> is set and enhanced. By means of a reduction in the thickness of the sheet, the loss is further improved. Moreover, by improving the purity of the steel, it is possible to avoid precipitated particles in the finished product which as undesirable traps impair the Bloch wall movement during magnetic reversal.

Types of magnetic steel sheet with particularly enhanced orientation and thus high permeability can be still further improved regarding the hysteresis in that the production process is controlled such that limitation of the size of the secondary recrystallised grains, and, respectively a large ratio of grain boundary length to grain surface, is ensured, and thus the Bloch wall spacing is reduced. The state of the art also includes additional improvement of the domain structure by way of applying an insulation layer which exerts a permanent tensile stress on the sheet substrate, and additionally by treatments which generate lines of local tension across or inclined to the direction of rolling. Among other things these can be local mechanical deformations (EP 0 409 389 A2), laser beam or electron treatments (EP 0 008 385 B1; EP 0 100 638 B1; EP 0 571 705 A2) or the etching-in of grooves (EP 0 539 236 B1).

This method of producing types of magnetic steel sheets with particular low-loss characteristics is associated with a disadvantage in that the combination of measures for forming the insulating layer and further domain refining is expensive. There is a further disadvantage in that the insulation layer is usually constructed in a series of complicated process steps which are carefully attuned to each other. This provides very little scope for undertaking still further parameter variations for economical and qualitative process optimisation.

The hitherto commonly used tension-applying layer is implemented in that the strip which has been cold-rolled to final thickness is subjected to annealing for primary recrystallisation and decarburising, wherein in a targeted way the surface is oxidised, then coated with MgO and suitable additives as a non-stick layer, and dried, and subsequently coiled and again annealed for the purpose of secondary recrystallisation and subsequent cleaning of the steel of precipitation-forming elements. During this annealing step, the non-stick layer reacts with the oxides on the strip surface and forms a forsterite layer ($Mg_2SiO_4$) which is also referred to as a "glass film". This film becomes rooted in the base material, a characteristic which enhances its adhesion.

In a further process step, as is for example known from DE 22 47 269 C3, solutions based on magnesium phosphate or aluminium phosphate or mixtures of the two with various additives such as for example chromium compounds and Si-oxide are applied to said film and burned-in at temperatures above 350° C. The tensile stress which the finished insulation layer transfers to the base material can be up to approx. 5 MPa. The improvements in hysteresis loss achieved in this way are of a magnitude of approx. 5%. Furthermore, magnetostriction is reduced.

The achievable improvement in loss is limited by the fact that, for forming the layer, oxidation processes are inevitable during which non-ferromagnetic particles and inhomogeneities form at the surface or in the surface zones, with said particles and inhomogeneities impeding the mobility of the Bloch walls during magnetic reversal, thus causing increased energy losses.

In newer developments, attempts have therefore been made to produce magnetic steel sheet without a glass film and with a surface which is as smooth as possible; and afterwards to apply tension applying insulation layers which do not require surface oxidation as a base. For example, sol-gel methods for layers with oxidic substances have been tried, as described in EP 0 555 867 A2. In this arrangement, the layer tensions have been created on the basis of the difference in the thermal expansion coefficients of the steel and the layer, and on the basis of the high temperature of between 800° C. and 1000° C. during formation of the layer. Other known methods include the application of thin layers onto sheet substrates made of magnetic steel sheet of extremely smooth surface by means of CVD or PVD methods such as electron beam evaporation, magnetron sputtering or vacuum arc evaporation, wherein layers or multiple layers of metal nitrides or metal carbides (e.g. TiN, BN, ZrN, AlN, Ti(CN), Cr2N, TiC, ZrC, WC) are produced, as described in EP 0 193 324 B1 or EP 0 910 101 A1.

With these types of layers it is possible to create tensile stress in the magnetic steel sheet of for example 8 MPa, however, their inadequate electrical insulation effect is disadvantageous so that they have to be covered by an additional insulating layer as described in EP 0 215 134 B1.

SUMMARY OF THE INVENTION

It is the object of the invention to generate highly permeable grain-oriented magnetic steel sheet which is suitable as the core material for particularly silent low-loss transformers.

This object is met by a grain-oriented magnetic steel sheet including an electrically insulating coating made of an amorphous carbon-hydrogen network.

Grain-oriented magnetic steel sheet according to the invention comprises a coating which exerts such tensile stress on the sheet and improves the hysteresis loss to such an extent that additional measures for refining the magnetic domain structure become redundant. The coating which according to the invention is formed from an amorphous carbon-hydrogen network adheres safely to the strip surface and provides high surface insulation resistance.

It is well-known that amorphous carbon-hydrogen networks, also known as a:C—H or diamond-like carbon (DLC) are very hard, chemically inert and provide good adhesion to steel alloys, as is for example described in EP 0 600 533 B1. Up to now, as e.g. described in DE 198 34 968 A1 or WO 99/47346 A1, these characteristics have been utilised for coatings of tools, which coatings must meet particular requirements in regard to their adhesion effect.

The same suitability is at the centre of the state of the art, known from DE 198 25 860 A1, which deals with the coating of piston rings.

Surprisingly it has been found that magnetic steel sheet which in the way according to the invention has been provided with a layer of an amorphous carbon-hydrogen network features considerably improved magnetic properties such as reduced hysteresis loss and increased magnetic polarisation. Presumably, this is due to the observed refinement in the magnetic domain structure which renders any additional treatment of the magnetic steel sheet for domain refining redundant.

Furthermore, magnetic steel sheet according to the invention achieves insensitivity of the magnetic characteristics to the sort of compressive strains that can occur in transformer cores. A further advantage associated with this is the reduced magnetostriction which makes it possible to construct more silent transformers. Moreover, the layer system according to the invention is thinner than conventional layer systems, thus permitting a higher stacking factor in the transformer core.

The electrically insulating coating of the grain-oriented magnetic steel sheet can be doped with one or several of the elements Si, O, N, B or F, preferably each ranging from 1 to 20 atomic per cent.

Particularly good magnetic characteristics of the magnetic steel sheet are achieved in that the electrically insulating coating exerts a tensile stress of at least 8 MPa on the sheet substrate.

To further improve adhesion between the sheet substrate and the amorphous carbon-hydrogen network, it is advantageous to arrange at least one adhesion-improving intermediate layer between the electrically insulating coating and the sheet substrate. This adhesion-improving intermediate layer can for example consist of an Si—C—O—H network or an Si—C—H network.

Further adhesion-improving intermediate layers that may be considered include titanium or titaniferous compounds, in particular titanium nitride, whereby the tensile stress on the sheet substrate can be further increased.

Preferably, the layer of magnetic steel sheet according to the invention comprises a surface insulation resistance of at least 10 Ohm*$cm^2$, as a result of which the necessary insulation effect is ensured.

With corresponding optimisation, at a sheet thickness of 0.30 mm, grain-oriented magnetic steel sheet according to the invention has a hysteresis loss (at a frequency of 50 Hertz and a polarisation of 1.7 Tesla) of $P_{1.7}$=0.90 W/kg; at a sheet thickness of 0.27 mm, of $P_{1.7}$=0.80 W/kg; and at a sheet thickness of 0.23 mm, of $P_{1.7}$=0.70 W/kg.

In a typical composition, the sheet substrate contains 2.5 weight % to 4.0 weight % silicon, up to 0.20 weight % manganese, up to 0.50 weight % copper, up to 0.065 weight % aluminium, up to 0.0150 weight % nitrogen, and at least 90 weight % iron. Furthermore, additionally one or several of the elements Cr, Ni, Mo, P, As, Sn, Sb, Se, Te, B or Bi, each with mass fractions of up to 0.2 weight % can be present.

The sheet substrate is produced from a steel melt as it is typically used in the production of grain-oriented magnetic steel sheet, with said steel melt comprising 2.5 weight % to 4.0 weight % Si, up to 0.100 weight % C, up to 0.20 weight % Mn, up to 0.50 weight % Cu, up to 0.035 weight % S, up to 0.065 weight % Al, up to 0.0150 weight % N, with the remainder being mainly Fe and the usual impurities as well as the above-mentioned additional alloying elements Cr, Ni, Mo, P, As, Sn, Sb, Se, Te, B or Bi, each with mass fractions of up to 0.2 weight %, by way of strip casting or continuous casting of slabs of between 20 and 300 mm in thickness. These slabs are subsequently rolled to hot strip, after which optional annealing of the hot strip can take place. Subsequent cold rolling, in one or several passes, takes place with intermediate annealing to an end thickness of 0.15 to 0.50 mm. This is followed by a primarily recrystallising annealing at decarburising conditions, as long as the mass fraction of carbon in the steel exceeds 0.005 weight A, as well as if need be by the application of a non-stick layer, followed by annealing for secondary recrystallisation and Goss texture formation (coarse-grain annealing), annealing for cleaning the steel of elements which are no longer required for controlling recrystallisation and texture formation (final annealing), if need be removal of any residue from the non-stick layer and removal from the strip surfaces of the oxides formed during previous annealing processes. Process conditions which ensure a surface of the sheet substrate which is free of any glass film are particularly advantageous in order to prevent the formation and subsequently necessary removal of the glass film after coarse-grain annealing.

Annealing for secondary recrystallisation with Goss texture formation, which is carried out as a continuous annealing process with a maximum of 15 min duration in the continous strip furnace, is a further preferred variant in the production of the sheet substrate. In this context, preferably annealing for cleaning the steel is also carried out as a continuous annealing process with a maximum of 15 min duration in the continuous strip furnace. In regard to process optimisation, these process steps achieve the best result if the formation of surface layers according to the invention is carried out directly in line with annealing in the continuous strip furnace.

The sheet substrate used can also be favourably influenced in that it is subjected to nitrogenizing annealing conditions between the first cold rolling and the secondary recrystallisation. This can take place by adding $NH_3$ to the annealing gas. As an alternative to this, the strip can be nitrogenized by means of suitable nitrogen-supplying additives to provide a non-stick layer.

A suitable method for producing grain-oriented magnetic steel sheet according to the invention with an electrically insulating coating from an amorphous carbon-hydrogen network consists of the formation of the coating of the strip-shaped sheet substrate with the electrically insulating coating taking place in a continuous strip method. Expediently, the application of adhesion-improving intermediate layers also takes place in a continuous strip method which is preferably arranged upstream of the continuous coating with the amorphous carbon-hydrogen network.

Both for coating with an amorphous carbon-hydrogen network and for the application of the adhesion-improving intermediate layers, either CVD (chemical vapour deposition) methods or PVD (physical vapour deposition) methods can be considered as coating methods. In the case of CVD methods, methods involving thermal activation or plasma activation and particularly preferred hollow-cathode glow-discharge methods can be considered. In the case of PVD methods, thermal evaporation, sputtering, or laser, electron beam or arc evaporation are suitable. Plasma-activated high-rate electron beam vaporisation is considered a particularly preferred embodiment of the PVD method. It is also possible for the individual coating steps to be carried out using different methods.

Advantageously, prior to coating, the roughness Ra of the surface of the steel substrate should be max. 0.5 µm as this contributes to a significant improvement in the magnetic characteristics.

BRIEF DESCRIPTION OF THE DRAWINGS

Below, the invention is explained in more detail by means of exemplary embodiments. The following are shown.

DETAILED DESCRIPTION OF THE INVENTION

Figure 1:
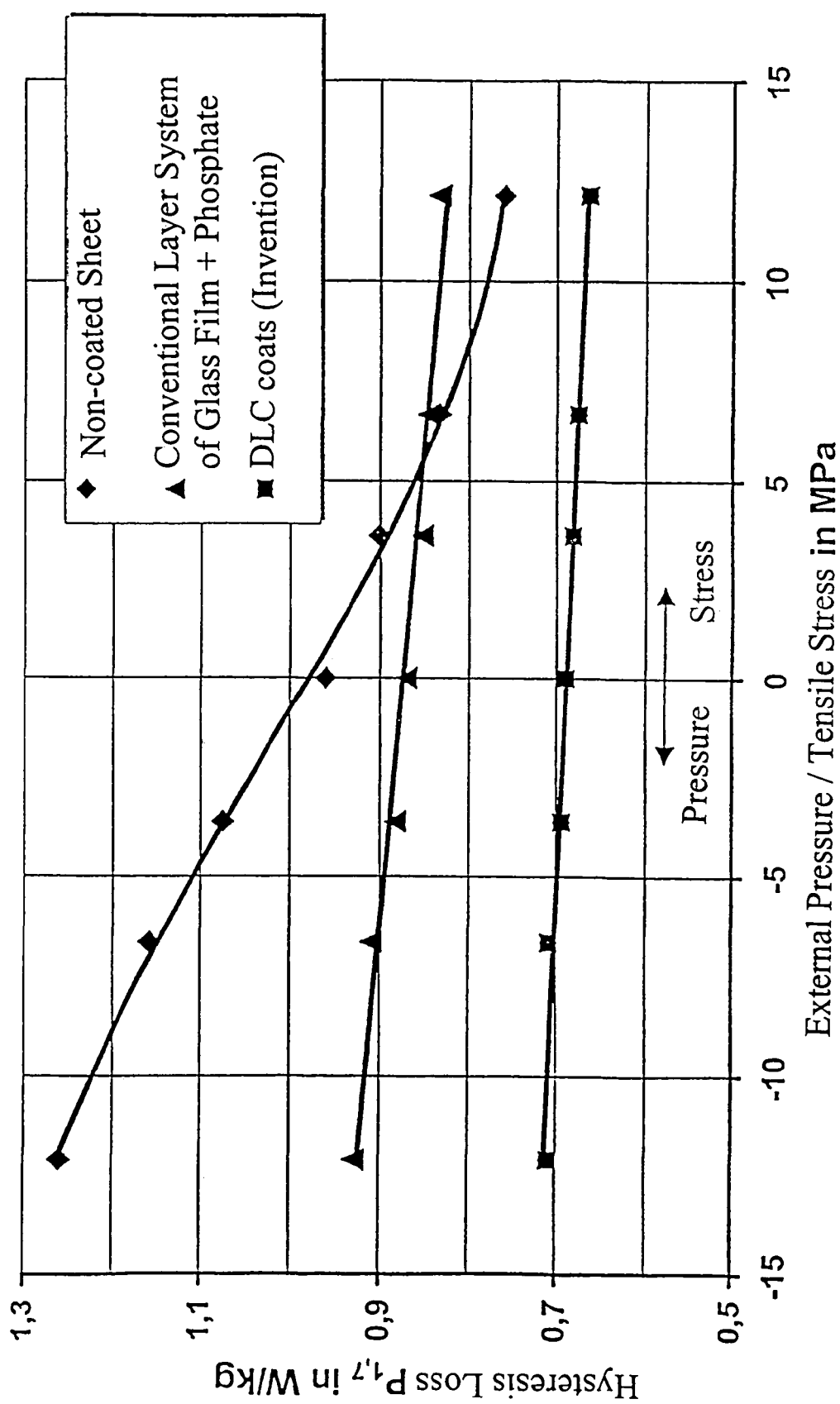
FIG. 1 the hysteresis loss plotted against the external pressure/tensile stresses of sheet which has been coated with a tension applying surface coating, for sheet coated with a conventional coating system, and for sheet coated according to the invention.

Table 1 shows for samples 1 to 4: the respective coating state; the respective tensile stress calculated from the curvature of a sample coated on one side (in the case of DLC, coated on one side; in the case of conventional insulation, subsequently freed of insulation on one side); the respective sheet thickness; the hysteresis loss $P_{1.7}$ (determined at a frequency of 50 Hz and a polarisation of 1.7 Tesla); and the magnetic polarisation at a magnetic field strength of 800 A/m.

TABLE 1

| Sample | State | Tensile stress**) [MPa] | Sheet thickness [mm] | $P_{1.7}$ W/kg | $J_{800}$ T |
|---|---|---|---|---|---|
| 1 | Reference (conventional insulation) | 5 | 0.213 | 0.89 | 1.90 |
| 2*) | DLC coating 1 µm | 12 | 0.220 | 0.84 | 1.90 |
| 3*) | DLC coating 2 µm | 24 | 0.216 | 0.69 | 1.92 |
| 4*) | DLC coating 2 µm | 24 | 0.221 | 0.71 | 1.93 |

*)examples according to the invention
**)calculated from the curvature of a sample coated on one side (in the case of DLC, coated on one side; in the case of conventional insulation, subsequently freed of insulation on one side).

The sheet substrates were taken from factory production of highly-permeable grain-oriented magnetic steel strip with conventional glass film and phosphate layers (sample 1). The phosphate layer was removed with 25 weight % of NaOH at 60° C., while the glass film beneath it was removed with a HCl/HF mixture. Subsequently the surface was smoothed by means of a chemical polish in $H_2O_2$/HF mixture.

The production of the coatings of samples 2 was carried out as follows:

By means of an intensive glow-discharge, generated by a hollow-cathode discharge method, in an argon-acetylene mixture, a plasma is generated from which on both sides of the magnetic steel sheet an amorphous carbon-hydrogen layer of great hardness and high residual compressive stress is deposited. Prior to the application of this layer, an adhesion-providing amorphous layer, approx. 0.5 µm in thickness, consisting of silicon, carbon and hydrogen (Si—C:H), is deposited by means of the same hollow-cathode based glow-discharge method. Instead of acetylene, TMS (tetramethylsilane) is used as a starting substance to deposit this layer.

The amorphous carbon-hydrogen layer created in this way, in Table 1 abbreviated as the DLC layer, of sample 2 is 1 µm in thickness. From the deflection of a reference sample which is coated only on one side, a residual compressive stress of 3 GPa is determined. Consequently, in the magnetic steel sheet of 0.25 mm in thickness, a tensile stress of approx. 12 MPa is generated. By means of a Franklin tester, an area resistance of $\geq 20$ Ωcm was determined for this layer.

The production of the coatings of samples 3 and 4 was carried out as follows:

By means of high-frequency glow-discharge in an argon-acetylene mixture, a plasma is generated from which on both sides of the magnetic steel sheet an amorphous carbon-hydrogen layer of great hardness and high residual compressive stress is deposited. Prior to the application of this layer, an adhesion-providing titanium layer, approx. 0.5 µm in thickness, is deposited by means of cathode sputtering. The transition from the titanium layer to the amorphous carbon-hydrogen layer takes place without interrupting the vacuum.

The amorphous carbon-hydrogen layer of samples 3 and 4 is 2 µm in thickness. From the deflection of a reference sample which was coated only on one side, a residual compressive-stress of 3 GPa is determined for the layer. Consequently, in the magnetic steel sheet of 0.25 mm thickness, a tensile stress of approx. 25 MPa is generated. By means of a Franklin tester, an area resistance of >20 Ωcm is determined for this layer.

The illustration of the domain structure in the same position of a sample, before and after coating according to the invention with an amorphous carbon-hydrogen network, shows a slightly domain-refining effect of an amorphous carbon-hydrogen layer 1 µm in thickness, and a highly domain-refining effect of an amorphous carbon-hydrogen layer 2 µm in thickness.

In order to determine the insensitivity to compressive strains, the hysteresis loss was measured depending on external tensile stress (positive values) and compressive stress (negative values). The results are shown in FIG. 1. The values determined for non-coated sheet are shown by lozenges; the values determined for sheet with a conventional layer system of glass film+phosphate are shown by triangles; and the values determined for sheet according to the invention are shown by squares.

Figure 2:
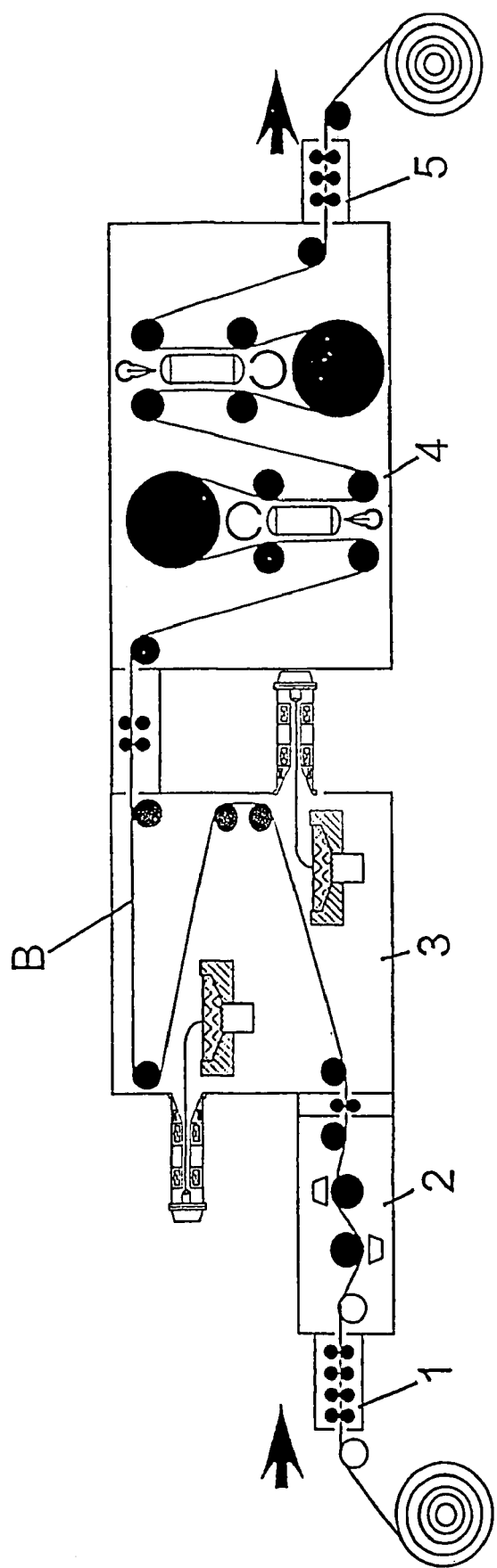
FIG. 2 a diagrammatic view of a device for double-sided coating of grain-oriented magnetic steel sheet comprising an adhesion-improving intermediate layer and a subsequent electrically insulating coating from an amorphous carbon-hydrogen network in a continuous strip method.

FIG. 2 diagrammatically shows an example of a plant for double-sided coating of grain-oriented magnetic steel sheet with an adhesion-improving intermediate layer and a subsequently applied electrically insulating coating consisting of an amorphous carbon-hydrogen network in a continuous strip method.

After being uncoiled and transferred to a high-vacuum zone which is closed off by locks 1, a strip B of magnetic steel sheet first passes through a device 2 for plasma fine-purification in which fine purification takes place e.g. by means of magnetic field reinforced glow-discharge in an Ar atmosphere.

The adhesion-improving intermediate layer is applied by high-rate electron beam vaporisation in a vaporisation plant 3 through which the strip B subsequently passes. These adhesion-improving layers consist of e.g. Ti or TiN. In the latter case it is advantageous if a reactive variant of electron beam vaporisation is applied, in which in a targeted way nitrogen is introduced as a reactive gas to the vacuum recipient. The use of plasma activation during vaporisation can also be advantageous.

Deposition of the electrically insulating coating consisting of an amorphous carbon-hydrogen network then takes place in a hollow-cathode glow-discharge device 4 without interruption, while the vacuum continues to be maintained. The use of a band hollow cathode is particularly advantageous in this context.

Thereafter, the coated strip B is removed from the vacuum zone by way of a lock 5 and is then coiled.

The invention claimed is:

1. A grain-oriented magnetic steel sheet comprising an electrically insulating coating made of an amorphous carbon-hydrogen network and a strip-shaped grain-oriented magnetic steel sheet substrate, wherein the electrically insulating coating exerts a tensile stress of at least 8 MPa on the strip-shaped sheet substrate.

2. The grain-oriented magnetic steel sheet according to claim 1, wherein the electrically insulating coating is doped with at least one of the elements Si, O,N,B or F.

3. The grain-oriented magnetic steel sheet according to claim 2, wherein the doping elements are contained in the electrically insulating coating in a range from 1 to 20 atomic per cent.

4. The grain-oriented magnetic steel sheet according to claim 1, wherein the coating has a surface insulation resistance of at least 10 $\Omega cm^2$.

5. The grain-oriented magnetic steel sheet according to claim 1, wherein the grain-oriented magnetic steel sheet has a thickness of 0.30 mm and a hysteresis loss of $P_{1.7} \leqq 0.90$ W/kg, at a frequency of 50 Hertz and a polarisation of 1.7 Tesla.

6. The grain-oriented magnetic steel sheet according to claim 1, wherein the sheet substrate contains 2.5 weight % to 4.0 weight % silicon, up to 0.20 weight % manganese, up to 0.50 weight % copper, up to 0.065 weight % aluminum, up to 0.0150 weight % nitrogen, and at least 90 weight % iron.

7. The grain-oriented magnetic steel sheet according to claim 6, wherein additionally at least one of the elements Cr, Ni, Mo, P, As, Sn, Sb, Se, Te, B or Bi, each with a mass fraction up to 0.2 weight %, is present.

8. The grain-oriented magnetic steel sheet according to claim 1, wherein the grain-oriented magnetic steel sheet has a thickness of 0.27 mm and a hysteresis loss of $P_{1.7} \leqq 0.80$ W/kg, at a frequency of 50 Hertz and a polarisation of 1.7 Tesla.

9. The grain-oriented magnetic steel sheet according to claim 1, wherein the grain-oriented magnetic steel sheet has a thickness of 0.23 mm and a hysteresis loss of $P1.7 \leqq 0.70$ W/kg, at a frequency of 50 Hertz and a polarisation of 1.7 Tesla.

10. The grain-oriented magnetic steel sheet according to claim 1, wherein at least one adhesion-improving intermediate layer is arranged between the electrically insulating coating and the strip-shaped sheet substrate.

11. The grain-oriented magnetic steel sheet according to claim 10, wherein at least one adhesion-improving intermediate layer consists of an Si—C—O—H network.

12. The grain-oriented magnetic steel sheet according to claim 10, wherein at least one adhesion-improving intermediate layer consists of an Si—C—H network.

13. The grain-oriented magnetic steel sheet according to claim 10, wherein at least one adhesion-improving intermediate layer consists of titanium or a titaniferous compound.

14. The grain-oriented magnetic steel sheet according to claim 13, wherein the titaniferous compound is titanium nitride.

15. A method for producing grain-oriented magnetic steel sheet with an electrically insulating coating from an amorphous carbon-hydrogen network according to claim 1, wherein coating of the strip-shaped sheet substrate with the electrically insulating coating takes place in a continuous strip method.

16. The method according to claim 15, wherein coating of the strip-shaped sheet substrate with the electrically-insulating coating takes place by means of a CVD (chemical vapour deposition) method.

17. The method according to claim 15, wherein coating of the strip-shaped sheet substrate with the electrically-insulating coating takes place by means of a PVD (physical vapour deposition) method.

18. The method according to claim 17, wherein coating of the strip-shaped sheet substrate with the electrically-insulating coating takes place by means of a plasma-activated PVD method.

19. The method according to claim 17, wherein coating of the strip-shaped sheet substrate with the electrically-insulating coating takes place by means of a hollow-cathode glow-discharge method.

20. The method according to claim 15, wherein the surface of the strip-shaped sheet substrate prior to coating has a roughness Ra of max. 0.5 µm.

21. A method for producing a grain-oriented magnetic steel sheet with an electrically insulating coating from an amorphous carbon-hydrogen network according to claim 10, wherein the coating of the strip-shaped sheet substrate with at least one adhesion-improving intermediate layer takes place in a continuous strip method prior to the application of the electrically insulating coating.

22. The method according to claim 21, wherein coating of the strip-shaped sheet substrate with at least one adhesion-improving intermediate layer takes place by means of a CVD (chemical vapour deposition) method.

23. The method according to claim 21, wherein coating of the skip-shaped sheet substrate with at least one adhesion-improving intermediate layer takes place by means of a PVD (physical vapour deposition) method.

24. The method according to claim 23, wherein coating of the strip-shaped sheet substrate with at least one adhesion-improving intermediate layer takes place by means of a plasma-activated PVD method.

25. The method according to claim 23, wherein coating of the strip-shaped sheet substrate with at least one adhesion-improving intermediate layer takes place by means of a hollow-cathode glow-discharge method.

\* \* \* \* \*